(12) United States Patent
Achsaf et al.

(10) Patent No.: US 7,866,996 B2
(45) Date of Patent: Jan. 11, 2011

(54) INTERNAL UFD

(75) Inventors: Nitzan Achsaf, Tel Aviv (IL); Moshe Raines, Tel Aviv (IL); Alon Zeigler, Ramat Gan (IL); Itzhakl Pomerantz, Kefar Saba (IL)

(73) Assignee: SanDisk IL Ltd., Kfar Saba (IL)

( * ) Notice: Subject to any disclaimer, the term of this patent is extended or adjusted under 35 U.S.C. 154(b) by 1119 days.

(21) Appl. No.: 11/550,813

(22) Filed: Oct. 19, 2006

(65) Prior Publication Data

US 2008/0123277 A1    May 29, 2008

(51) Int. Cl.
*H01R 13/62* (2006.01)
(52) U.S. Cl. .................. 439/159; 439/297; 439/945
(58) Field of Classification Search .............. 439/76.1, 439/159, 911, 341, 945, 946, 297; 361/679.02, 361/679.4, 737; 235/451, 440, 492
See application file for complete search history.

(56) References Cited

U.S. PATENT DOCUMENTS

| | | | | |
|---|---|---|---|---|
| 4,855,779 | A * | 8/1989 | Ishikawa et al. | 396/211 |
| 5,035,633 | A * | 7/1991 | Kobayashi et al. | 439/140 |
| 5,184,282 | A * | 2/1993 | Kaneda et al. | 361/737 |
| 5,537,293 | A * | 7/1996 | Kobayashi et al. | 361/737 |
| 5,803,762 | A * | 9/1998 | Green | 439/347 |
| D429,728 | S * | 8/2000 | Hays | D14/436 |
| 6,097,605 | A * | 8/2000 | Klatt et al. | 361/737 |
| 6,112,996 | A * | 9/2000 | Matsuo | 235/492 |
| 6,266,312 | B1 * | 7/2001 | Akiba | 720/610 |
| 6,435,409 | B1 * | 8/2002 | Hu | 235/441 |
| 6,490,163 | B1 * | 12/2002 | Pua et al. | 361/737 |
| 6,601,766 | B2 * | 8/2003 | Nakagawa et al. | 235/451 |
| 6,733,329 | B2 * | 5/2004 | Yang | 439/518 |
| 6,784,870 | B2 * | 8/2004 | Yin | 345/156 |
| 6,834,810 | B2 * | 12/2004 | Maruyama | 235/492 |
| 6,976,624 | B2 * | 12/2005 | Hsiao | 235/451 |
| 7,014,484 | B2 * | 3/2006 | Hagiwara | 439/159 |
| 7,036,742 | B2 * | 5/2006 | Learmonth et al. | 235/492 |
| 7,069,370 | B2 * | 6/2006 | Sukegawa et al. | 710/305 |

(Continued)

FOREIGN PATENT DOCUMENTS

DE    20 2004 009390    8/2004

(Continued)

*Primary Examiner*—Neil Abrams
(74) *Attorney, Agent, or Firm*—Vierra Magen Marcus & DeNiro LLP (57) ABSTRACT

The present invention discloses a system including: (a) a host device including: (i) a cavity; and (ii) a socket, recessed in the cavity; and (b) a UFD configured to be reversibly operationally connected to the host device via the socket, wherein the UFD is configured to physically reside substantially in the cavity when the UFD is operationally connected to the socket. Also disclosed is a UFD system including: (a) a first part having components of a UFD, wherein the components include a primary connector and an electronics assembly; and (b) a second art having a UFD holder and a secondary connector, wherein the UFD holder is configured to reversibly accommodate the first part, wherein a dimension of the first part parallel to an insertion direction of the primary connector is shorter than a dimension of the second part parallel to an insertion direction of the secondary connector. In another embodiment, a UFD may be inserted into a UFD slot in an edge of a host panel.

12 Claims, 8 Drawing Sheets

U.S. PATENT DOCUMENTS

| | | | |
|---|---|---|---|
| 7,090,541 B1 * | 8/2006 | Ho | 439/660 |
| 7,162,547 B2 * | 1/2007 | Hosaka et al. | 710/8 |
| 7,170,754 B2 * | 1/2007 | Asom et al. | 361/737 |
| 7,330,923 B2 * | 2/2008 | Wenstrand et al. | 710/303 |
| 7,578,691 B2 * | 8/2009 | Weksler et al. | 439/347 |
| 7,784,951 B2 * | 8/2010 | Shirakura | 353/119 |
| 2003/0099803 A1 * | 5/2003 | Niitsuma | 428/64.2 |
| 2004/0075977 A1 | 4/2004 | Lee | |
| 2005/0181645 A1 | 8/2005 | Ni | |
| 2005/0204086 A1 | 9/2005 | Le | |
| 2006/0010458 A1 * | 1/2006 | Georgis | 720/600 |
| 2007/0218728 A1 * | 9/2007 | Jow | 439/159 |
| 2007/0247803 A1 * | 10/2007 | Eickholdt | 361/685 |
| 2007/0263068 A1 * | 11/2007 | Hong | 348/14.02 |
| 2008/0204992 A1 * | 8/2008 | Swenson et al. | 361/684 |

FOREIGN PATENT DOCUMENTS

| | | | |
|---|---|---|---|
| JP | 7-320005 | * | 12/1995 |
| JP | 2005-197909 | * | 7/2005 |

* cited by examiner

\* D < L, W, and C

INTERNAL UFD

This patent application claims the benefit of U.S. Provisional Patent Application No. 60/803,050 filed May 24, 2006.

FIELD AND BACKGROUND OF THE INVENTION

The present invention relates to systems and methods for accommodating an internal UFD (USB flash disk) in a host system such that the UFD does not significantly protrude beyond the exterior of the host system.

A UFD is a well-known device for portable data storage. A typical shape of a UFD resembles a short, straight, flat stick, making the UFD easy to grip by a user, hang on a key chain, and store in a pocket. When plugged into a lost system, typically a notebook computer or a digital TV, a prior alt UFD generally significantly protrudes beyond the exterior of the host system. The UFD typically protrudes perpendicular to the panel containing the USB socket.

This configuration makes it easy to plug the UFD into the host, see that the UFD is plugged in, and unplug the UFD when desired. In this configuration, however, the UFD alters the natural from factor of the host system, making it cumbersome and risky to handle the host system while the UFD is plugged in. In addition, the protrusion of the UFD presents an increased risk of damage to both the host system and the UFD. Furthermore, in situations where the aesthetic appearance of the host system is important, such as an expensive digital TV in a living room, the protrusion of the UFD from the panel is considered a noticeable problem as well.

Traditionally, this was not considered a significant issue, as the UFD was a short-term "guest" to the host system, which was operated most of the time without a resident UFD. Recently, with the proliferation of large-capacity UFDs, which sometimes include not only data files but applications and operating systems as well, there are cases where a UFD has to remain coupled to the host system for a long period of time, including when the host system is being powered down, or when host system is placed in (or removed from) the system carrying case. This is practically impossible with the current state-of-the-art UFD.

Many home entertainment devices are designed to be used in living rooms, and are considered as "part of the furniture". This implies that the device facade is carefully designed to be aesthetic and safe. When such devices require a UFD for device operation, such as a digital TV that uses a dongle (i.e. socket connection and controller) for porting of content, the dongle is preferably used on the facade of the device. This configuration is chosen for the convenience of the user, and to enable a good line-of-sight connection with a wireless r-emote control.

Prior art dongles are typically long enough to be conveniently held by a user (e.g. 40-80 mm), and stick out when plugged into the USB socket on the front panel of a device. This not only interferes with the aesthetic design of the device, but also creates a practical problem as the dongle may be accidentally pulled out or damaged by user passing by the device. In addition, the entertainment room is a location frequented by young children. A television is typically located at an elevation that is accessible to a child's reach. A easily-removable device protruding from a television is a both a safety hazard and a candidate for domestic vandalism.

It would be desirable to have an internal UFD that does not protrude beyond the exterior contour of a host system.

SUMMARY OF THE INVENTION

It is the purpose of the present invention to provide systems and methods for a UFD that does not protrude beyond the contour of a host system.

For the purpose of clarity, several terms which follow are specifically defined for use within the context of this application. The term "UFD" is used in this application to refer to a USB flash disk. The term "dongle" is used in this application to refer to a relatively small physical device, rigidly or semi-rigidly supported by a socket of a host system, containing data storage, and typically (but not necessarily) having, one or more controls. The term "host panel" is used in this application to refer to a panel that hosts a USB socket in a device that has one or more generally planar panels and a USB socket in one of the panels. The expression "reside substantially in a cavity" is used in this application to refer a UFD with more than half of the volume of the UFD inside the cavity.

In a preferred embodiment of the present invention, the shape of the UFD is configured to match a deep cavity in the contour of the host panel, so that practically all of the UFD's volume is contained within the cavity when the UFD is inserted in the host system.

In another preferred embodiment of the present invention, the UFD is configured to have a very low profile, spreading the functional components of the UFD inside and around the socket with minimal protrusion beyond the host panel.

As the UFD in that preferred embodiment may be too small to be handled when not engaged in the host system, another preferred embodiment of the present invention includes a UFD holder configured to accommodate the small UFD when the UFD is outside the host system. This configuration enables the UFD to be safely and conveniently carried and used with other host systems. In a variation of this embodiment, the UFD holder connects to the small UFD at an end of the UFD holder, thus chancing the form factor of the combined UFD/UFD holder unit into the form factor of a standard UFD.

In another preferred embodiment of the present invention, the UFD holder encompasses the small UFD when the UFD is engaged in the UFD holder. In the embodiment, the original size of the UFD holder is not altered.

In another preferred embodiment of the present invention, when the UFD is engaged in the host panel, an ejection mechanism ejects the UFD out of the cavity of the host panel only when the host system is instructed by the user or by the host software. This mechanism serves two purposes. The mechanism eliminates untimely ejection of the UFD from the host panel during file transfer, and enables easy removal of the UFD from the host panel without using tools.

In another preferred embodiment of the invention, the UFD has an aperture or a recess near the outer edge of the UFD. In the event that the ejection mechanism that ejects the UFD from the cavity fails to operate, the user can extract the UFD from the host panel by pulling the UFD out with a hooked tool via the aperture or recess.

In another preferred embodiment of the present invention, the cavity of the host panel is configured to have at least one parallel alignment guide, and the UFD is configured to have a matching tunnel. Thus, when the UFD is inserted into the cavity, the UFD slides accurately into place as the UFD tunnel aligns with the cavity's alignment guide, ensuring a smooth engagement of the UFD plug into the USB socket.

In another preferred embodiment of the present invention, the USB socket of the host panel is recessed in the host panel cavity by an amount that is slightly more than the width of a typical UFD (typically 20 mm), and has a mechanism for rotating approximately 90 degrees in a vertical or horizontal plane. When a general-purpose UFD is plugged into a USB socket, the UFD typically protrudes beyond the contour of the host panel by an amount that is approximately the difference between the length of the UFD and the depth of the host panel cavity. After engaging the UFD in the USB socket, the user can rotate the UFD and the USB socket together to a position in which the major plane of the UFD is practically parallel to the major plane of the host panel, and is completely accommodated in the recess. An optional door or shutter can cover the recess in order to hide the UFD.

In other preferred embodiments of the present invention, an internal UFD for a host system is part of a host panel of the host system. In such embodiments, the UFD is inserted into a slot or compartment of the host panel, providing a unobtrusive, and yet easily accessible, UFD for the host system.

Therefore, according to the present invention, there is provided for the first time a system including: (a) a host device including: (i) a cavity; and (ii) a socket, recessed in the cavity; and (b) a UFD configured to be reversibly operationally connected to the host device via the socket, wherein the UFD is configured to physically reside substantially in the cavity when the UFD is operationally connected to the socket.

Preferably, the UFD is configured to substantially occupy the cavity when the UFD is operationally connected to the socket.

Preferably, the UFD is configured to physically reside completely in the cavity when the UFD is operationally connected to the socket.

Preferably, the UFD includes at least one recess for connecting an extraction tool to the UFD.

Preferably, the UFD includes a handle for removing the UFD from the cavity.

Preferably, the UFD includes at least one ridge for removing the UFD from the cavity.

Preferably, the UFD includes at least one clip for securing the UFD in the cavity.

Preferably, the system further includes: (c) a wicket for reversibly covering the cavity when the UFD is not occupying the cavity, the wicket configured to uncover the cavity when the UFD is inserted in the cavity.

Preferably, the host device includes an ejection mechanism for automatic ejection of the UFD from the socket.

More preferably, the ejection mechanism is operative to eject the UFD in such a way that the UFD can then be manually extracted from the cavity.

More preferably, the ejection mechanism is controlled by a user-activated key.

More preferably, the ejection mechanism is controlled by a software program of the host device.

Most preferably, the software program is configured to verify that the automatic ejection is safe to perform.

According to the present invention, there is provided for the first time a host panel of a host device, the host panel including: (a) a recess for accommodating a UFD; (b) a socket, in the recess, for operational connection of the UFD; and (c) a socket-swivel mechanism for positioning the socket alternately in: (i) a first position in which the UFD is substantially perpendicular to the host panel for operational connection and disconnection of the UFD from the socket, and (ii) a second position in which the UFD is substantially parallel with the host panel.

Preferably, the recess is configured to accommodate the UFD in a way that the UFD substantially occupies the recess.

Preferably, the host panel further includes: (d) a wicket for reversibly covering the recess when the UFD is not occupying the recess, the wicket configured to uncover the recess when the UFD is inserted in the recess.

According to the present invention, there is provided for the first time a UFD including: (a) an end cap for housing electronic circuitry of the UFD; and (b) a connector, wherein a dimension of the end cap parallel to an insertion direction of the connector is smaller than a dimension of the connector parallel to an insertion direction of the corrector.

According to the present invention, there is provided for the first time a UFD system including: (a) a first part having components of a UFD, wherein the components include a primary connector and an electronics assembly; and (b) a second part having a UFD holder and a secondary connector, wherein the UFD holder is configured to reversibly accommodate the first part, wherein a dimension of the first part parallel to an insertion direction of tire primary connector is shorter than a dimension of the second part parallel to an insertion direction of the secondary connector.

Preferably, the UFD system is configured to be operational upon satisfying at least one condition of: (a) the first part being operationally engaged in a host device; and (b) the first part being operationally engaged in the second part, and the second part being engaged in the host device.

According to the present invention, there is provided for the first time a UFD including: (a) a UFD body; and (b) a connector, wherein a dimension of the UFD body parallel to an insertion direction of the connector is smaller than at least one other dimension of the UFD body.

According to the present invention, there is provided for the first time a method for configuring a host device for unobtrusive operational connection of a UFD, the method including the steps of: (a) recessing a cavity in a host panel of the host device; and (b) providing a socket in the cavity for reversibly operationally connecting the UFD to the host device.

These and further embodiments will be apparent from the detailed description and examples that follow,

BRIEF DESCRIPTION OF THE DRAWINGS

The present invention is herein described, by way of example only, with reference to the accompanying, drawings, wherein:

FIG. 5B shows a top view of the mini-UFD shown in FIG. 4, according to a preferred embodiment of the present invention;

FIG. 5D is a schematic block diagram of the mini-UFD holder shown in

FIG. 5C containing the mini-UFD shown in FIG. 5A, according to a preferred embodiment of the present invention;

DESCRIPTION OF THE PREFERRED EMBODIMENTS

The present invention relates to systems and methods for accommodating an internal UFD in a host system such that the LTD does not protrude beyond the exterior of the host system. The principles and operation for an internal UFD, according to the present invention, may be better understood with reference to the accompanying description and the drawings.

Figure 1:
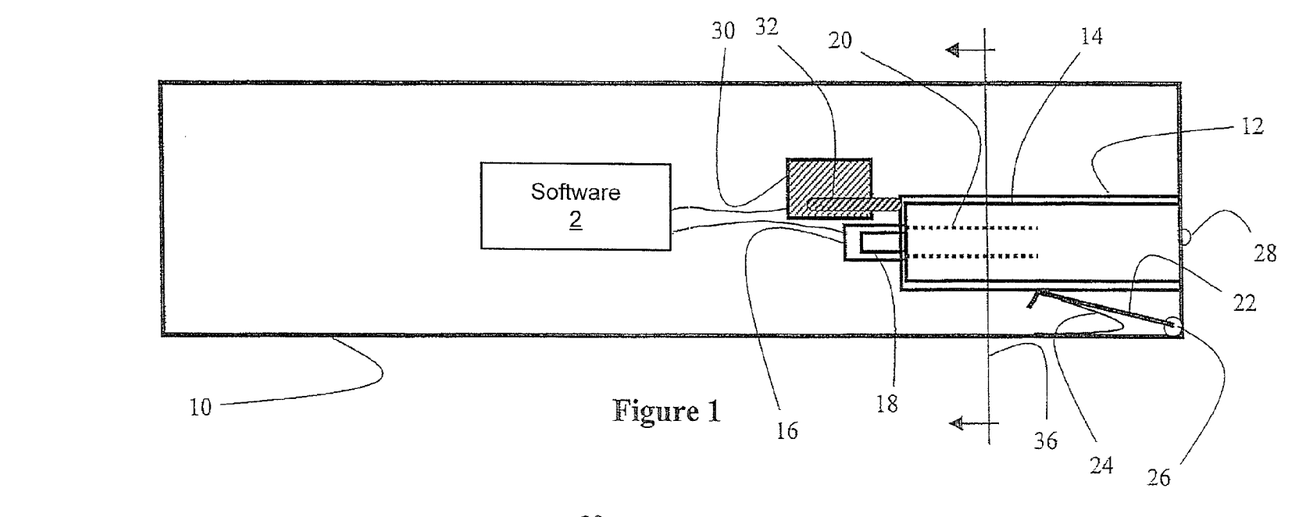
FIG. 1 shows a cross-sectional view of a notebook computer having an internal UFD slot, according to a preferred embodiment of the present invention.

Referring now to the drawings, FIG. 1 shows a cross-sectional view of a notebook computer having an internal UFD slot, according to a preferred embodiment of the present invention. A notebook computer 10, having a form factor similar to a ThinkPad™ computer (available from Lenovo™ Group Ltd, 1 Manhattanville Rd., Suite PH, Purchase, New York) is configured to have a deep recess 12, long enough to accommodate the full length of a UFD 14 (typically 4-7 cm). A USB socket 16 is installed in the inner wall of recess 12, accommodating a USB connector 18 of LTD 14. Longitudinal guide rails 20 (shown in phantom) on the side walls of recess 12 accommodate two longitudinal guide supports (not shown) on the sides of UFD 14, guiding UFD 14 into USB socket 16 when UFD 14 is inserted into recess 12. Longitudinal guide rails 20 are presented more clearly in FIG. 3C. Returning to FIG. 1, a wicket 22, which is pushed by a spring 24, turns on an axis 26. Wicket 22 normally shuts the opening of recess 12 when UFD 14 is not inserted in recess 12. UFD 14 pushes wicket 22 down upon insertion of UFD 14.

An ejection button 28 on the host panel (not explicitly shown) of computer 10, or on the exposed end of UFD 14, is used to initiate ejection of UFD 14. A software application 2 senses the depression of ejection button 28, and activates an actuator 30 to push a pin 32 against UFD 14, pushing UFD 14 slightly out of recess 12. A user can then grab and remove UFD 14. Once UFD 14 is removed, wicket 22 shuts the opening of recess 12, leaving computer 10 with a "closed" aesthetic appearance. Optionally, the activation of ejection button 28 initiates a software program 2 that verifies that it is safe to extract UFD 14, before mechanically ejecting UFD 14. Such software is available, among others, from MicroSoft® in the Windows® operating system.

Figure 2:
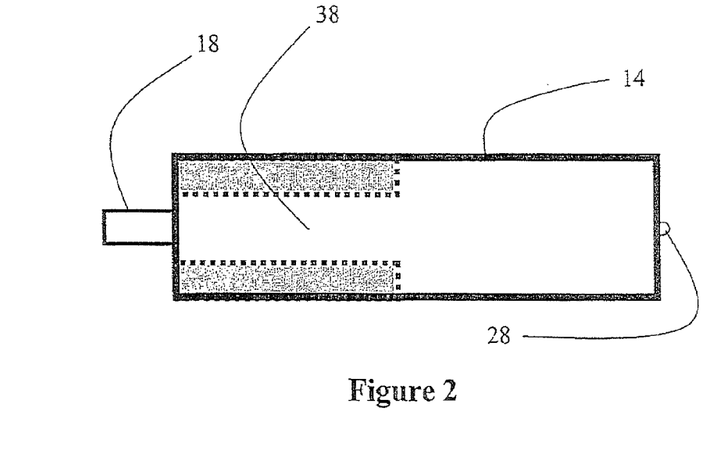
FIG. 2 is a schematic block diagram of a UFD compatible with the computer shown in FIG. 1, according to a preferred embodiment of the present invention.

FIG. 2 is a schematic block diagram of a UFD compatible with the computer shown in FIG. 1, according to a preferred embodiment of the present invention UFD 14 is shown with USB corrector 18, which connects to internal UFD socket 16 (shown inside computer 10 in FIG. 1), using longitudinal guide supports 38, located on both sides of UFD 14, to slide into recess 12 of FIG. 1 and safely connect to USB socket 16 of FIG. 1. Ejection button 28 enables safe ejection of UFD 14.

Figure 3A:
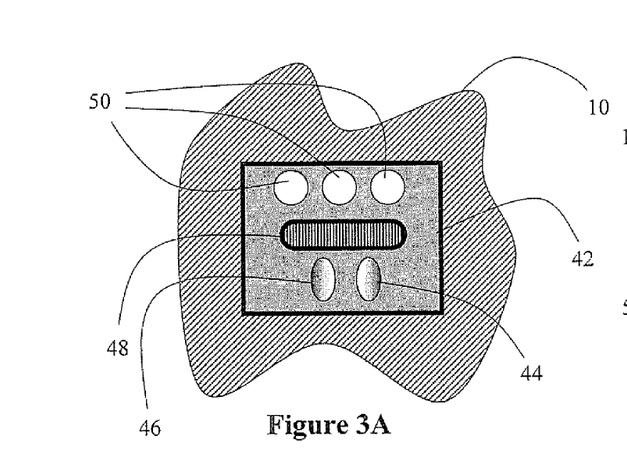
FIG. 3A shows a rear view of the UFD shown in FIG. 2 plugged into the computer of FIG. 1, according to a preferred embodiment of the present invention.

FIG. 3A shows a rear view of UFD 14 of FIG. 2 plugged into computer 10 of FIG. 1, according to a preferred embodiment of the present invention. A UFD rear panel 42 is visible as shown when UFD 14 is plugged into computer 10. Ejection button 48 helps to safely remove UFD 14. Apertures 44 and 46 are available in the event that ejection button 48 is not activating ejection, enabling a user to mechanically hook a tool (not shown) though apertures 44 and 46, and extract UFD 14 manually. Moreover, indicator lights 50 provide indications about the status of UFD 14.

Figure 3B:
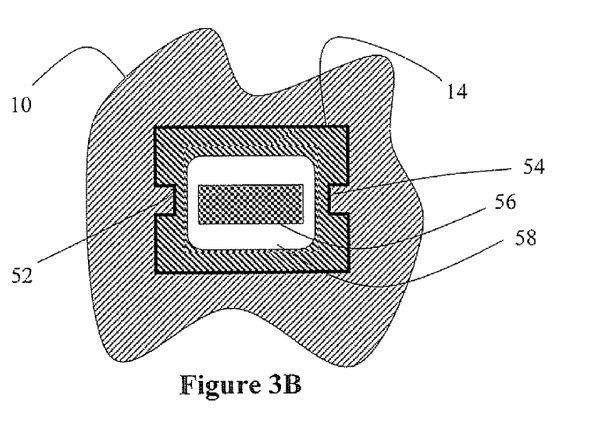
FIG. 3B shows a cross-sectional view of the UFD shown in FIG. 2 plugged into the computer of FIG. 1, according to a preferred embodiment of the present invention.
Figure 3C:
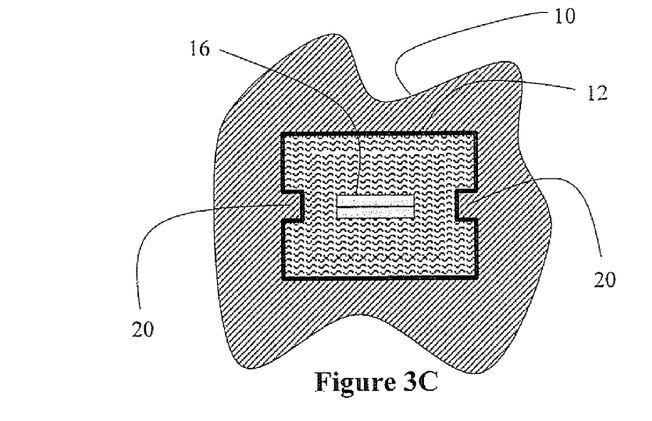
FIG. 3C shows an end view of the recess shown in FIG. 1, according to a preferred embodiment of the present invention.

A better understanding of the structure of recess 12 may be gained by inspection of FIGS. 3B and 3C, which show a cross-sectional view and end view (with and without UFD 14 engaged in recess 12, respectively) taken along a perspective line 36 shown in FIG. 1. FIG. 3B shows a cross-sectional view of UFD 14 of FIG. 2 plugged into computer 10 of FIG. 1. FIG. 3B shows recess 12 when UFD 14 is engaged in recess 12 of computer 10. For smooth insertion, UFD 14 slides along longitudinal grooves 52 and 54. The electronics 56 of UFD 14 are located inside UFD body 58.

Figure 3D:
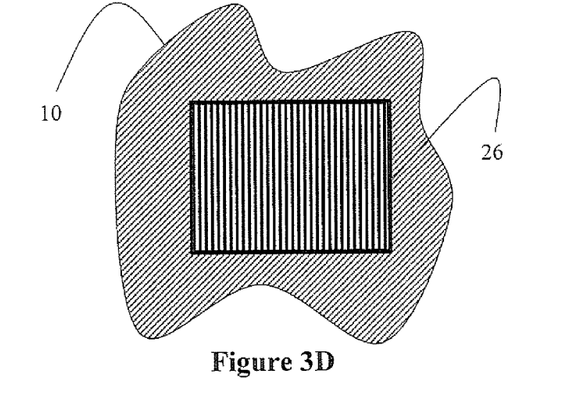
FIG. 3D shows a front view of the recess shown in FIG. 1 when a UFD is not present, according to a preferred embodiment of the present invention.

FIG. 3C shows an end view of recess 12 of FIG. 1, according to a referred embodiment of the present invention. FIG. 5C shows recess 12 when UFD 14 is not engaged in recess 12 of computer 10, USB socket 16, which is located substantially with computer 10, as well as longitudinal guide rails 20, which help UFD 14 to reach USB socket 16 at the proper angle for insertion, are shown FIG. 3D shows a front view of the recess shown in FIG. 1 when a UFD is not present. FIG. 3D shows recess 12 when UFD 14 is not engaged in computer 10. In this case, wicket 26 is shown covering recess 12 of computer 10.

Figure 4:
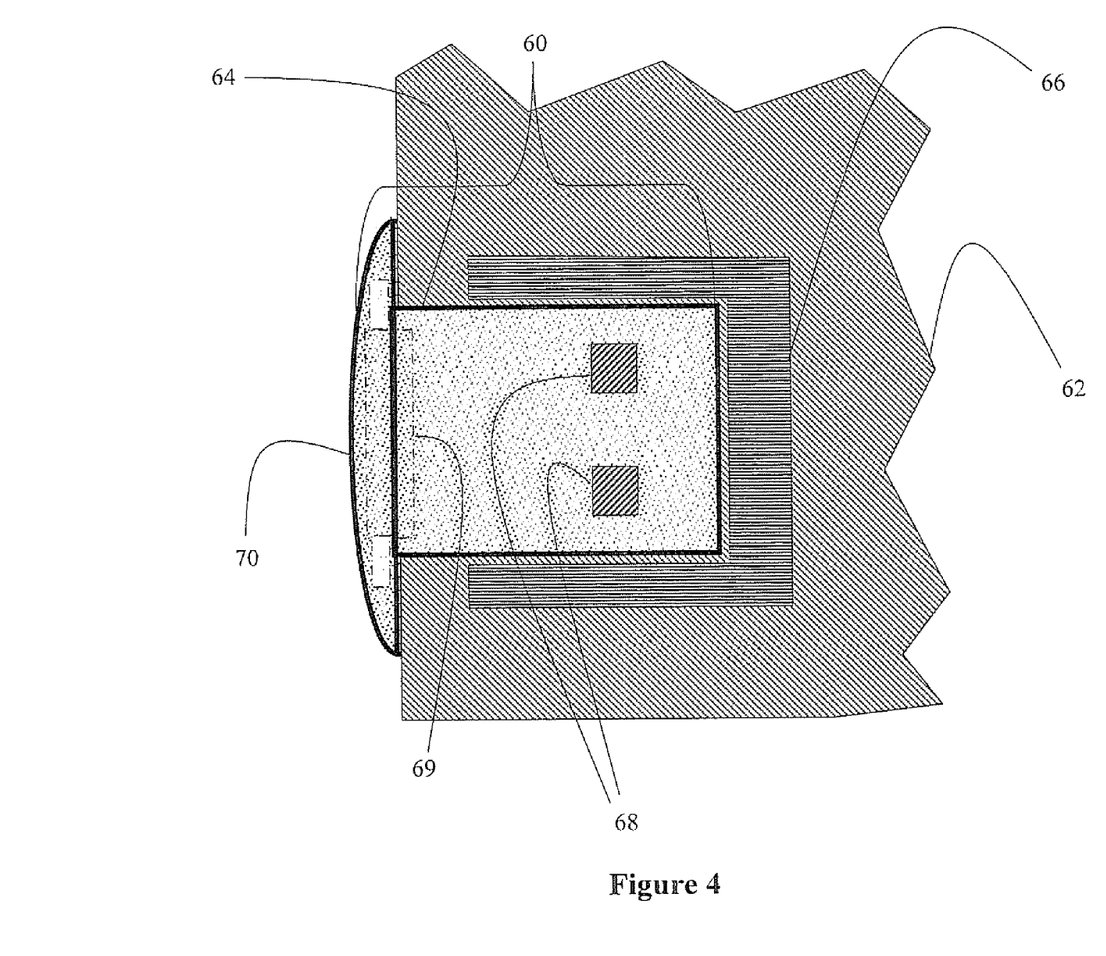
FIG. 4 is a schematic block diagram of a mini-UFD plugged into a host system, according to another preferred embodiment of the present invention.

FIG. 4 is a schematic block diagram of a mini-UFD plugged into a host system, according to another preferred embodiment of the present invention. A mini-UFD 60 is shown engaged in a host system 62. A USB connector 64 is shown engaged in a USB socket 66 of a host system 62, USB connector slots 68 are shown as well. Electronics assembly 69 is shown as a dotted box which includes a portion that extends into USB connector 64 indicating that electronics assembly 69 is partially located inside USB connector 64. Electronics assembly 69 includes a printed circuit board (not shown). In order to minimize changes in appearance and dimensions of the exterior of host system 62, a UFD end cap 70 contours to the exterior of host system 62.

Figure 5A:
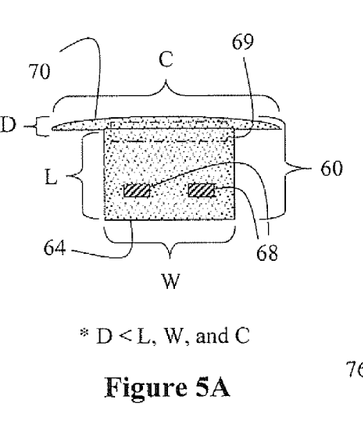
FIG. 5A shows a side view of the mini-UFD shown in FIG. 4, according to a preferred embodiment of the present invention.

FIG. 5A shows a side view of mini-UFD 60 of FIG. 4, according to a preferred embodiment of the present invention. Both USB connector 64 and UFD end cap 70 are shown. USB connector 64 meets the USB 2.0 industry specification. USB connector 64 can be a Mini-A or Mini-B connector within the USB 2.0 specification. Dimension L (connector length), dimension W (connector width), dimension C (cap diameter), and dimension D (cap depth) of mini-UFD 60 are also shown in FIG. 5A. Dimension D is less than any of dimension L, dimension W, and dimension C. The electronic circuitry of mini-UFD 60 resides primarily in end cap 70.

Figures 5B, 5D:
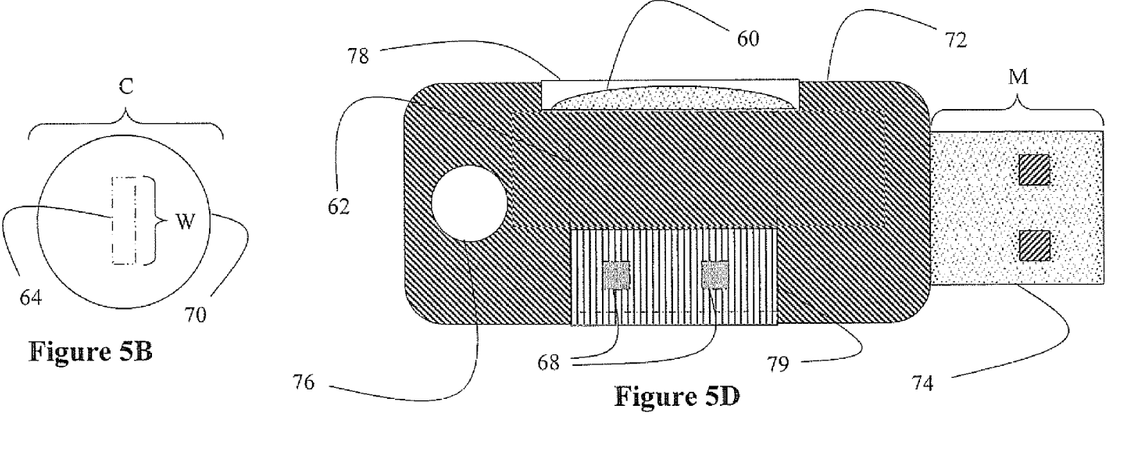

FIG. 5B shows a top view of tire mini-UFD shown in FIG. 5A, according to a preferred embodiment of the present invention. Dimensions C and W of mini-UFD 60 are shown. Other elements of mini-UFD 60 from FIG. 5A are not shown in FIG. 5B to emphasize dimension C and dimension W. While end cap 70 is indicated in FIG. 5B with dimension C representing cap diameter, it is noted that end cap 70 can have contours other than a circle.

Figure 5C:
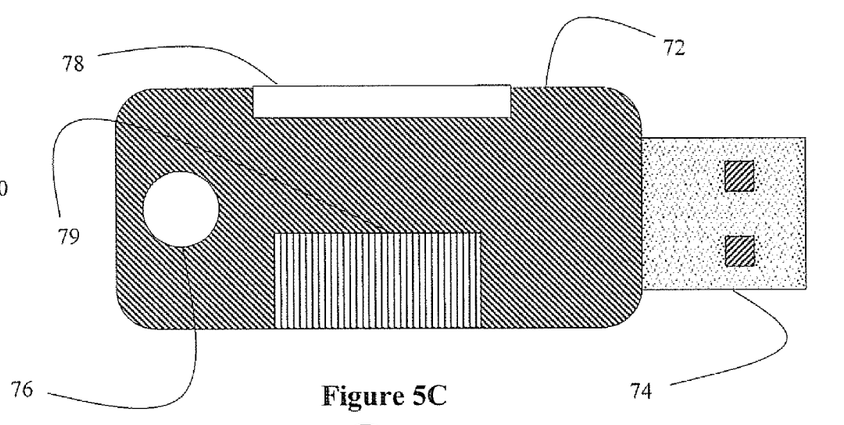
FIG. 5C is a schematic block diagram of an empty mini-UFD holder, according to a preferred embodiment of the present invention.

FIG. 5C is a schematic block diagram of a UFD holder, according to a preferred embodiment of the present invention. An empty UFD holder 72 is shown with a USB connector 74 and a carrying aperture 76, UFD holder 72 also includes a dedicated opening 78 and a USB socket 79 (located inside UFD holder 72), which can accommodate a mini-UFD, such as mini-UFD 60 of FIG. 5A. FIG. 5D is a schematic block diagram of mini-UFD holder 72 of FIG. 5C containing mini-UFD 60 of FIG. 5A, according to a preferred embodiment of the present invention. In order to convert the form factor of mini-UFD 60 into the form factor of a standard UFD, mini-UFD 60 is inserted into UFD holder 72 in dedicated opening 78, and USB connector 64 is engaged in USB socket 79. As was mentioned above, USB connector 64 can be a Mini-A or Mini-B USB connector. Once inserted, a user can use the device (i.e. UFD holder 72 containing mini-UFD 60) as a regular UFD, and transport the device easily using carrying aperture 76.

Figure 6A:
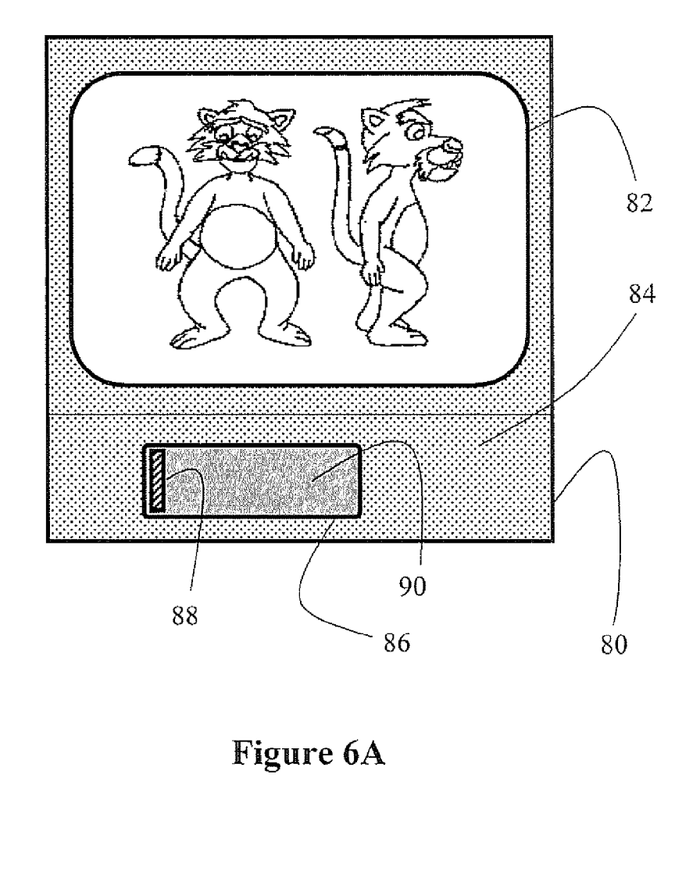
FIG. 6A shows an example of a television having an internal UFD compartment, according to a preferred embodiment of the present invention.

FIG. 6A shows an example of a television having an internal UFD compartment, according to a preferred embodiment of the present invention. A television 80 is shown with a screen 82 on a host panel 84, and a dedicated recess 86 having a USB socket 88. Socket 88 is shown in an orientation where the insertion direction is perpendicular to host panel 84. Since a UFD is not inserted into socket 88 in FIG. 6A, a back plate 90 of recess 86, which is parallel to host panel 84, is visible. To engage a UFD (not shown) into television 80, the UFD is inserted into socket 88, and then rotated, as will be explained in FIG. 6B.

Figure 6B:
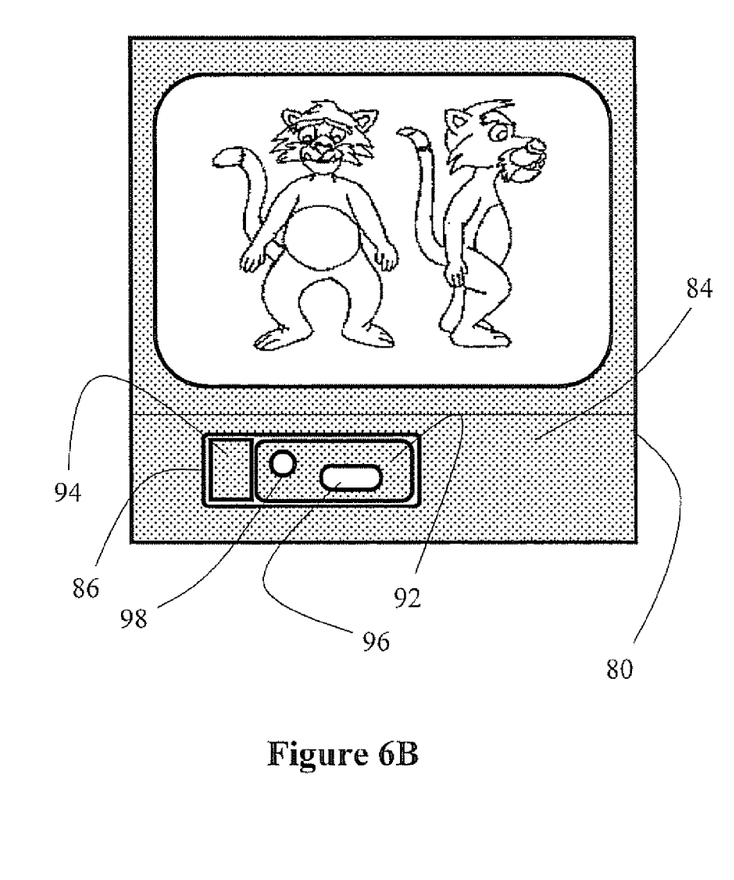
FIG. 6B shows the television shown in FIG. 6A with a UFD inside the recess, according to a preferred embodiment of the present invention.

FIG. 6B shows television 80 of FIG. 6A with a UFD inside recess 86, according to a preferred embodiment of the present invention A UFD 92, having a connector 94, has been rotated, after insertion into socket 88 of FIG. 6A (not shown in FIG. 6B), to become parallel to host panel 84, thus residing inside recess 86, aid not changing the form factor of television 80. When UFD 92 is in this orientation, the status of UFD 92 can be viewed via a UFD indication panel 96 that is integral with UFD 92, and changed via a UFD control button 98 that is integral with UFD 92.

Figure 7A:
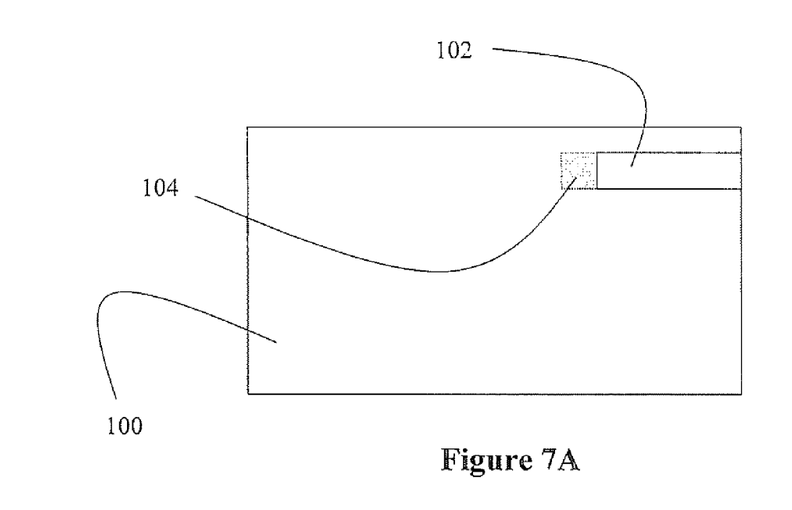
FIG. 7A shows a top view of a host panel, of a host system, having an internal UFD slot in an edge of the host panel, according to a preferred embodiment of the present invention.

FIG. 7A shows a top view of a host panel, of a host system, having an internal UFD slot in an edge of the host panel, according to a preferred embodiment of the present invention A host panel 100 of a host system (not shown) having a UFD slot 102 with a concealed socket region 104 is shown. An example of a host system suited for this embodiment is a laptop computer. For example, host panel 100 may be the cover of the laptop computer. UFD slot 102 is shown vacant, but is occupied when a UFD (not shown) is engaged in UFD slot 102. UFD slot 102 can also be occupied by a slot protector (not shown) when no UFD is engaged in UFD slot 102

Figure 7B:
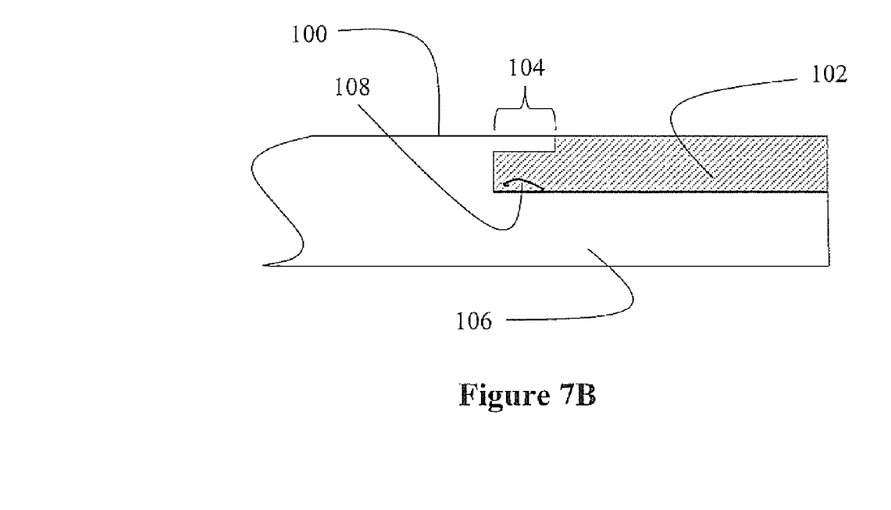
FIG. 7B shows a cut-away side view of the host system having an internal UFD slot in an edge of the host panel, shown in FIG. 7A, according to a preferred embodiment of the present invention.

FIG. 7B shows a cut-away side view of the host system having an internal UFD slot in an edge of the host panel, shown in FIG. 7A, according to a preferred embodiment of the present invention. A host system side cut-away 106 is shown with UFD slot 102. The top edge cut-away 106 represents host panel 100. A UFD socket 108, having a contact-engaging spring, is shown in concealed socket region 104.

Figure 7C:
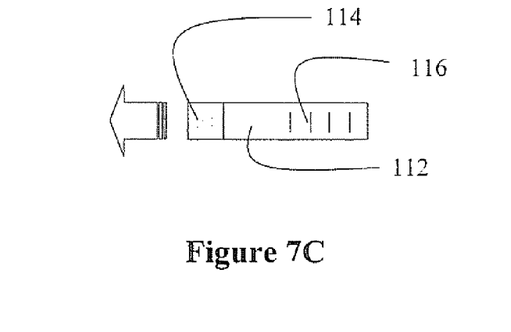
FIG. 7C shows a top view of a UFD for the host panel shown in FIG. 7A, according to a preferred embodiment of the present invention.

FIG. 7C shows a top view of a UFD for the host panel shown in FIG. 7A. A UFD 112 is shown having a UFD connector 114 at one end for operationally connecting UFD 112 to UFD socket 108 of FIG. 7B. UFD connector 114 is located on the bottom side of UFD 112, as shown by the dashed line in FIG. 7C. UFD 112 has ridges 116 for grasping UFD 112 when inserting and removing, UFD 112 from UFD slot 102 (shown in FIG. 7A). An arrow indicates the direction in which UFD 112 is inserted into and removed from UFD slot 102

Figure 7D:
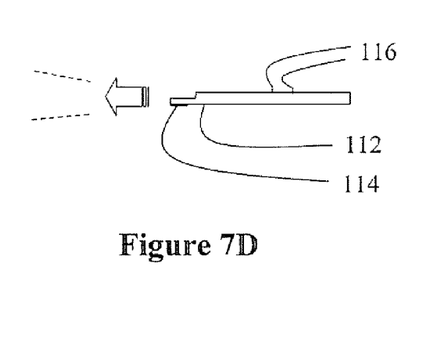
FIG. 7D shows a side view of the UFD, shown in FIG. 7C, for the host panel shown in FIG. 7A, according to a preferred embodiment of the present invention.

FIG. 7D shows a side view of the UFD, shown in FIG. 7C, for the host panel shown in FIG. 7A, according to a preferred embodiment of the present invention. UFD 112 is configured to have a very thin profile. An arrow indicates the direction in which UFD 112 is inserted into and removed from UFD slot 102 (shown in FIG. 7B). UFD 112 of FIG. 7D and UFD slot 102 of FIG. 7B are shown at different scales.

Figure 8A:
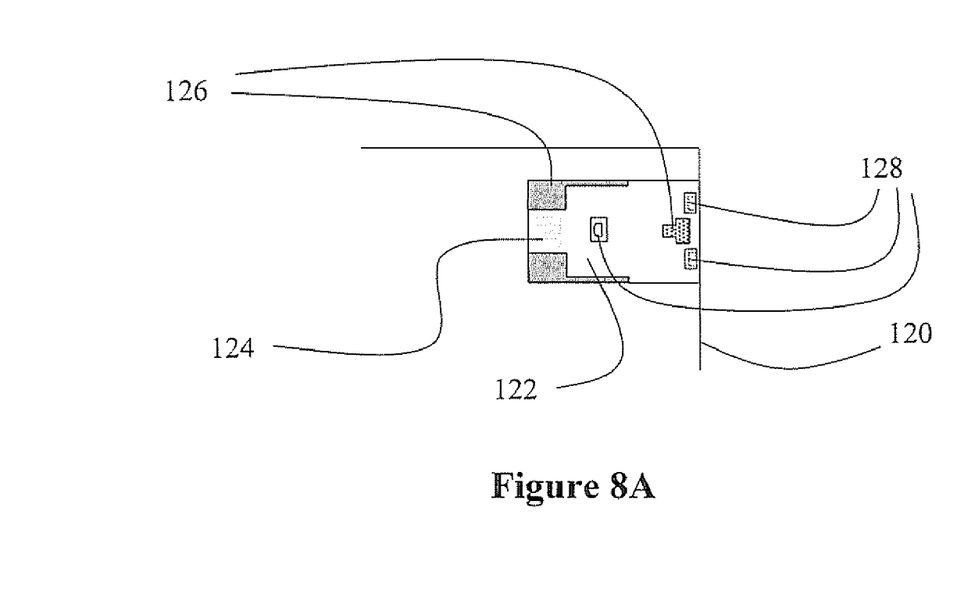
FIG. 8A shows a top view of a host panel, of a host system, having an internal UFD slot in an edge of the host panel, according to another preferred embodiment of the present invention.

In another preferred embodiment a UFD of the present invention is configured to operate with a different insertion/extraction mechanism. FIG. 5A shows a top view of a host panel, of a host system, having an internal UFD slot in an edge of the host panel, according to another preferred embodiment of the present invention. A host panel 120 of a host system (not shown) having a UFD slot 122 with a UFD socket 124 is shown. Support elements 126 and clip recesses 128 secure a UFD (not shown) when engaged in UFD slot 122. In this embodiment, UFD socket 124 is configured to serve as an engaging spring as well.

Figure 8B:
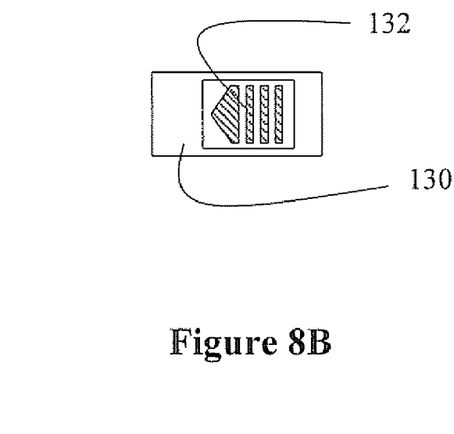
FIG. 8B shows a top view of a UFD for the host panel shown in FIG. 8A, according to a preferred embodiment of the present invention.
Figure 8C:
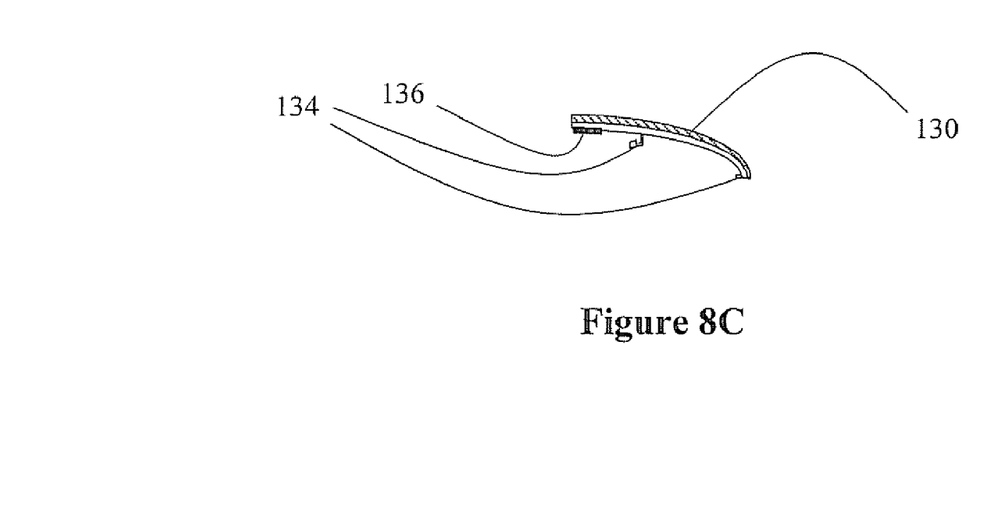
FIG. 8C shows a side view of the UFD shown in FIG. 8B, according to a preferred embodiment of the present invention.

FIG. 8B shows a top view of a UFD for the host panel shown in FIG. 8A. A UFD 130 having, ridges 132 is shown. An arrow, incorporated into ridges 132, indicates the direction in which UFD 130 is inserted into and removed from UFD slot 122 (shown in FIG. 8A). FIG. 8C shows a side view of the UFD shown in FIG. 8B, according to a preferred embodiment of the present invention. It can be seen that the side profile of UFD 130 has a slight curvature which enables a user to insert and remove UFD 130 with his/her fingertip by pressing on ridges 132. Clips 134 engage in clip recesses 128 of UFD slot 122 (shown in FIG. 9A) in order to secure UFD 130 in host panel 120, and to make contact between a UFD connector 136 and UFD socket 124.

Figure 9A:
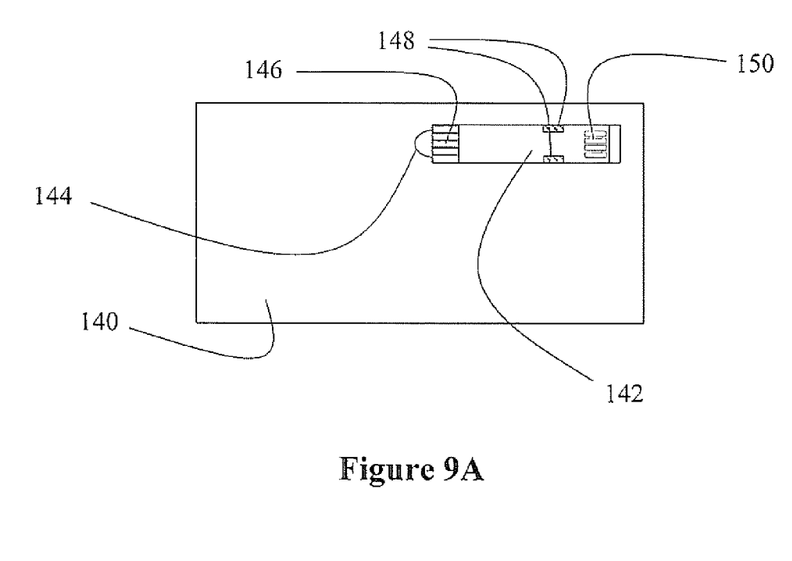
FIG. 9A shows a top view of a host panel, of a host system, having an internal UFD compartment in the host panel, according to a preferred embodiment of the present invention.

FIG. 9A shows a top view of a host panel, of a host system, having an internal LED compartment in the host panel, according to a preferred embodiment of the present invention, A host panel 140 of a host system (not shown) having a UFD compartment 142 is shown. Within UFD compartment 142, there are a fingertip recess 144, a deep recess 146, clip recesses 148, and a UFD socket 150. In this embodiment, UFD socket 150 is configured to serve as an engaging spring as well.

Figure 9B:
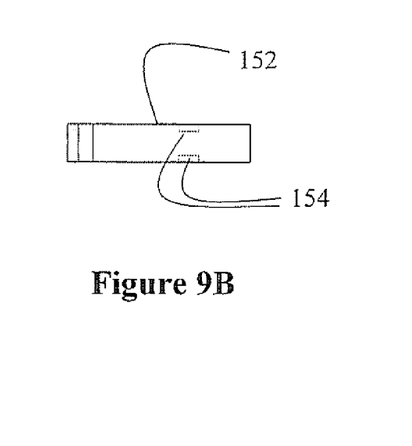
FIG. 9B shows a top view of a UFD for the host panel shown in FIG. 9A, according to a preferred embodiment of the present invention.
Figure 9C:
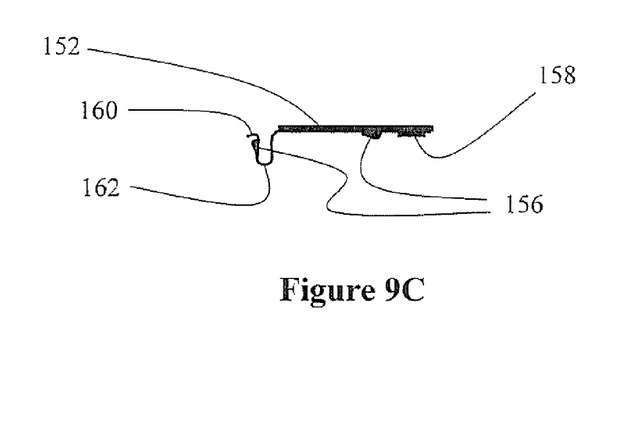
FIG. 9C shows a side view of the UFD shown in FIG. 9B, according to a preferred embodiment of the present invention

FIG. 9B shows a top view of a UFD for the host panel shown in FIG. 9A. A UFD 152 is shown with clips 154. Clips 154 are located on the bottom side of UFD 152, as shown by the dashed in FIG. 9B. FIG. 9C shows a side view of the UFD shown in FIG. 9B. UFD 152 is shown with clips 156 for securing UFD 152 in UFD compartment 142 (shown in FIG. 9A). A UFD connector 158 operationally connects to UFD socket 150 when UFD 152 is engaged in UFD compartment 142. It can be seen in FIG. 9C that UFD 152 has a finger catch 160 with a loop handle 162 for inserting and removing UFD 152 from UFD compartment 142. Finger catch 160 and loop handle 162 reside in fingertip recess 144 and deep recess 146, respectively, when UFD 152 is engaged in UFD compartment 142.

While the invention has been described with respect to a limited number of embodiments, it will be appreciated that many variations, modifications, and other applications of the invention may be made.

What is claimed is:

1. A system comprising:
a host device including:
a cavity;
a socket, recessed in said cavity, said socket configured to receive a USB flash disk (UFD) to be operationally connected to said host device, said socket configured such that the UFD resides at least substantially in said cavity when the UFD is operationally connected to said socket;
an ejection mechanism for automatic ejection of the UFD from said socket; and
a software program that is configured to sense depression of an ejection button on the UFD and to eject the UFD from the socket in response thereto.

2. The system of claim 1, wherein said UFD is configured to physically reside completely in said cavity when said UFD is operationally connected to said socket.

3. The system of claim 1, wherein said UFD includes at least one recess for connecting an extraction tool to said UFD.

4. The system of claim 1, wherein said UFD includes a handle for removing said UFD from said cavity.

5. The system of claim 1, wherein said UFD includes at least one ridge for removing said UFD from said cavity.

6. The system of claim 1 wherein said UFD includes at least one clip for securing said LED in said cavity.

7. The system of claim 1, the system further comprising:
a wicket for reversibly covering said cavity when said UFD is not occupying said cavity, said wicket configured to uncover said cavity when said UFD is inserted in said cavity.

8. The system of claim 1, wherein said ejection mechanism is operative to eject said UFD in such a way that said UFD can then be manually extracted from said cavity.

9. The system of claim 1, wherein said ejection mechanism is controlled by a user-activated button.

10. The systems of claim 1, wherein said software program is configured to verify that said automatic ejection is safe to perform.

11. A method for configuring a host device for unobtrusive operational connection of a USB flash disk (UFD), the method comprising the steps of:
recessing a cavity in a host panel of the host device;
providing a socket in said cavity, said socket configured to receive a UFD to be operationally connected to said host device, said socket configured such that the UFD resides at least substantially in said cavity when the UFD is operationally connected to said socket;
providing an ejection mechanism in the host device for automatic ejection of the UFD from said socket; and
providing a software program that is configured to sense depression of an ejection button on the UFD and to eject the UFD from the socket in response thereto.

12. The system of claim 1, further comprising a UFD having an ejection button.

* * * * *

UNITED STATES PATENT AND TRADEMARK OFFICE
CERTIFICATE OF CORRECTION

PATENT NO. : 7,866,996 B2
APPLICATION NO. : 11/550813
DATED : January 11, 2011
INVENTOR(S) : Achsaf et al.

It is certified that error appears in the above-identified patent and that said Letters Patent is hereby corrected as shown below:

On the Title Page, item [75] Inventors: Delete "Alon Zeigler, Ramat Gan (IL); Itzhakl Pomerantz, Kefar Saba (IL)" and replace with -- Alon Ziegler, Ramat Gan (IL); Itzhak Pomerantz, Kefar Saba (IL) --

Signed and Sealed this
Twenty-fourth Day of May, 2011

David J. Kappos
*Director of the United States Patent and Trademark Office*